United States Patent [19]

Ohyama et al.

[11] Patent Number: 5,119,272
[45] Date of Patent: Jun. 2, 1992

[54] CIRCUIT BOARD AND METHOD OF PRODUCING CIRCUIT BOARD

[75] Inventors: Sadahiro Ohyama, Chigasaki; Noriaki Sekine, Atsugi; Jiro Nakano, Hatano; Tetsuya Takahashi, Atsugi; Yasumi Ushikubo, Yamato; Masahiro Hirano, Atsugi, all of Japan

[73] Assignee: Mitsumi Electric Co., Ltd., Chofu, Japan

[21] Appl. No.: 285,373

[22] Filed: Dec. 16, 1988

Related U.S. Application Data

[63] Continuation of Ser. No. 74,940, Jul. 17, 1987, abandoned.

[30] Foreign Application Priority Data

Jul. 21, 1986 [JP] Japan .................. 61-171376
Feb. 18, 1987 [JP] Japan .................. 62-22389
Feb. 18, 1987 [JP] Japan .................. 62-35224

[51] Int. Cl.⁵ .................................. H05K 1/16
[52] U.S. Cl. .................... 361/402; 361/400; 338/307; 338/309; 174/260
[58] Field of Search ........... 174/257, 260; 361/400, 361/402, 403; 338/307, 308, 309

[56] References Cited

U.S. PATENT DOCUMENTS

| | | | |
|---|---|---|---|
| 3,381,256 | 4/1968 | Schuller et al. | 338/309 |
| 3,710,195 | 1/1973 | Sada et al. | 174/260 X |
| 3,939,381 | 2/1976 | Meany | 361/402 |
| 4,018,940 | 4/1977 | Morgan | 427/97 X |
| 4,051,550 | 9/1977 | Seno et al. | 361/402 |
| 4,131,516 | 12/1978 | Bakos et al. | 427/97 X |
| 4,157,407 | 6/1979 | Peiffer | 427/97 X |
| 4,191,789 | 3/1980 | Brown et al. | 174/257 X |
| 4,234,626 | 11/1980 | Peiffer | 427/97 |
| 4,360,570 | 11/1982 | Andreades et al. | 427/97 X |
| 4,574,094 | 3/1986 | DeLuca et al. | 427/97 X |
| 4,671,854 | 6/1987 | Ishikawa et al. | 29/852 X |
| 4,715,117 | 12/1987 | Enomoto | 29/851 |
| 4,728,534 | 3/1988 | Ho et al. | 338/307 X |
| 4,783,642 | 11/1988 | Takada et al. | 338/309 |

FOREIGN PATENT DOCUMENTS

| | | | |
|---|---|---|---|
| 1451047 | 7/1966 | France | 338/309 |
| 1276535 | 6/1972 | United Kingdom | 29/852 |

Primary Examiner—Gerald P. Tolin
Assistant Examiner—Paramita Ghosh
Attorney, Agent, or Firm—Ladas & Parry

[57] ABSTRACT

A circuit board includes an insulative ceramic substrate, electrode portions and wiring portions formed on the ceramic substrate by selectively removing portions of a conductor layer plated on said ceramic substrate, a resistor layer formed on the ceramic substrate and connected to the electrode portions, and a pair of connecting thick film conductors for electrically connecting the thick film resistor and the conductor layer on both ends of the thick film resistor. The resistor layer includes a thick film resistor which is formed on the ceramic substrate. The conductor layer and the thick film resistor each have an end portion which is formed directly on the same connecting thick film conductor.

4 Claims, 11 Drawing Sheets

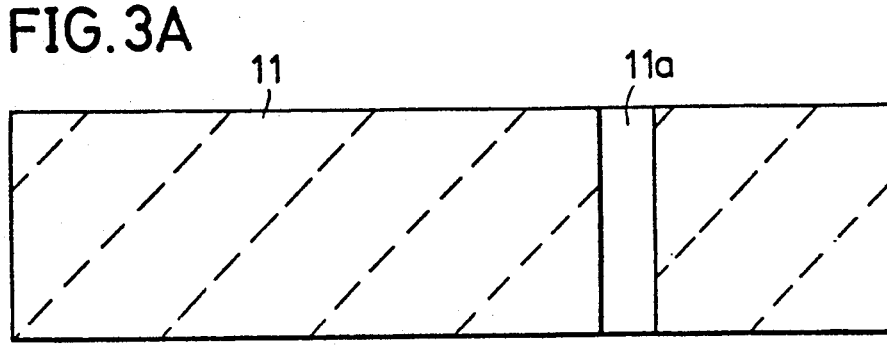
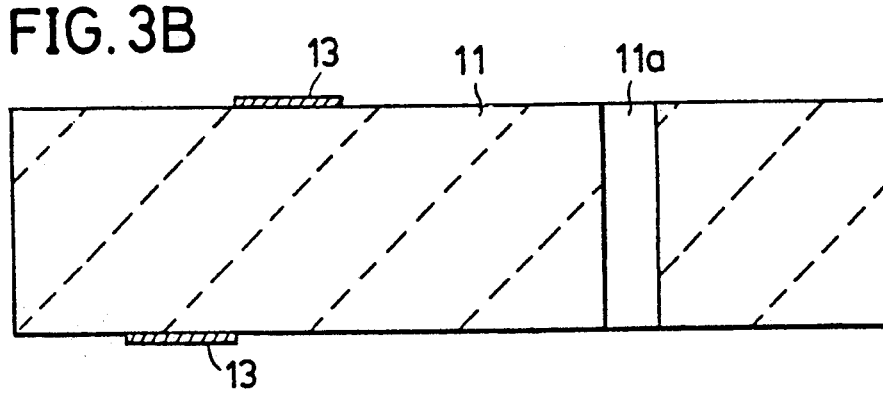
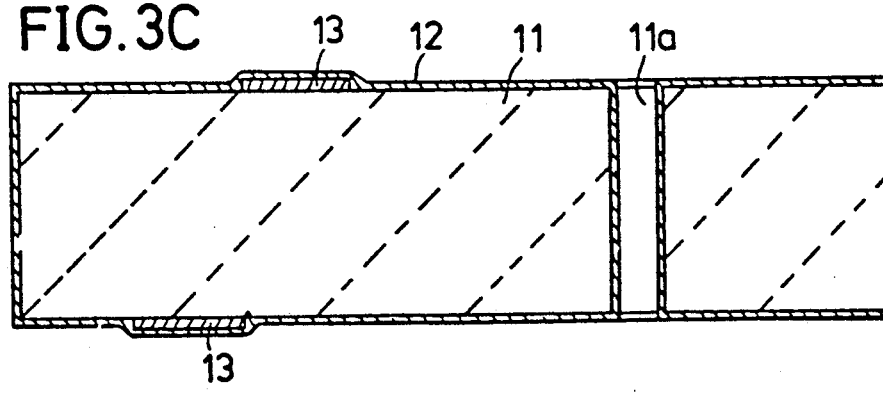

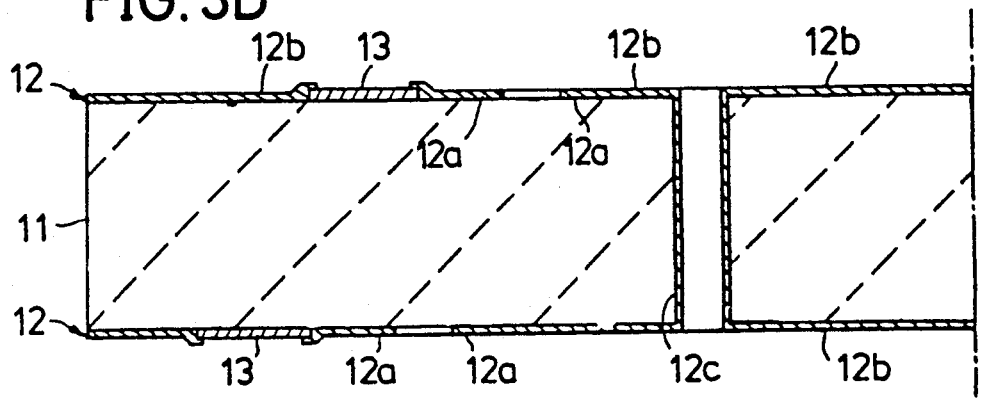
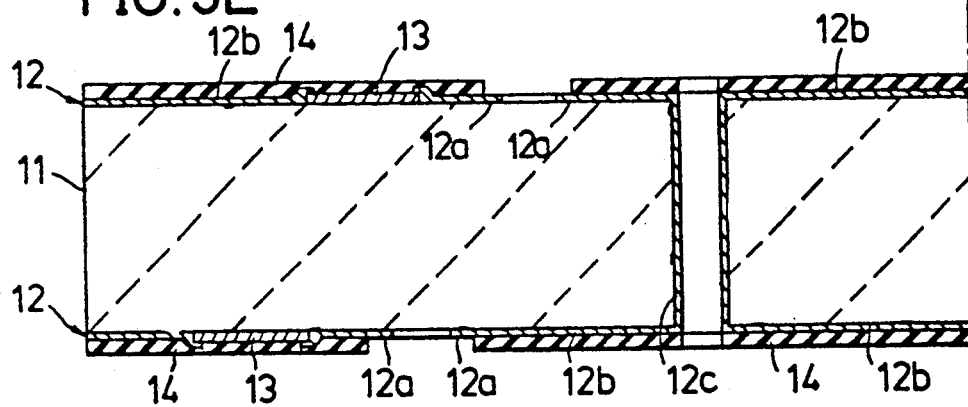
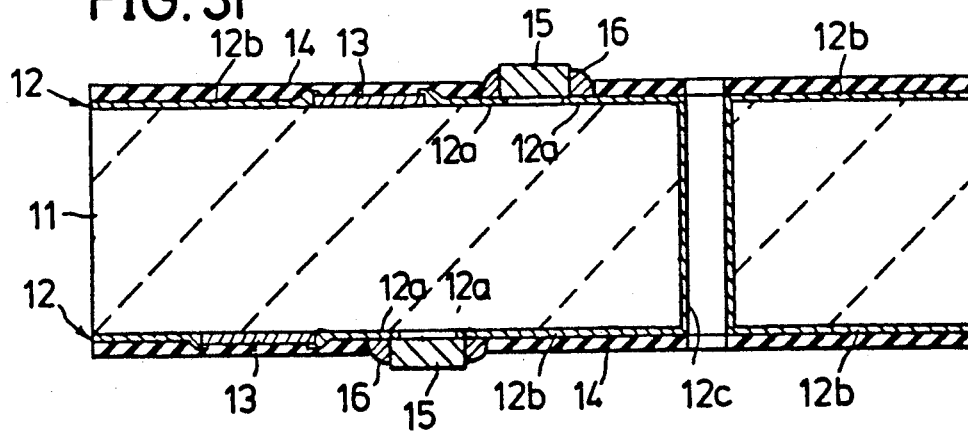

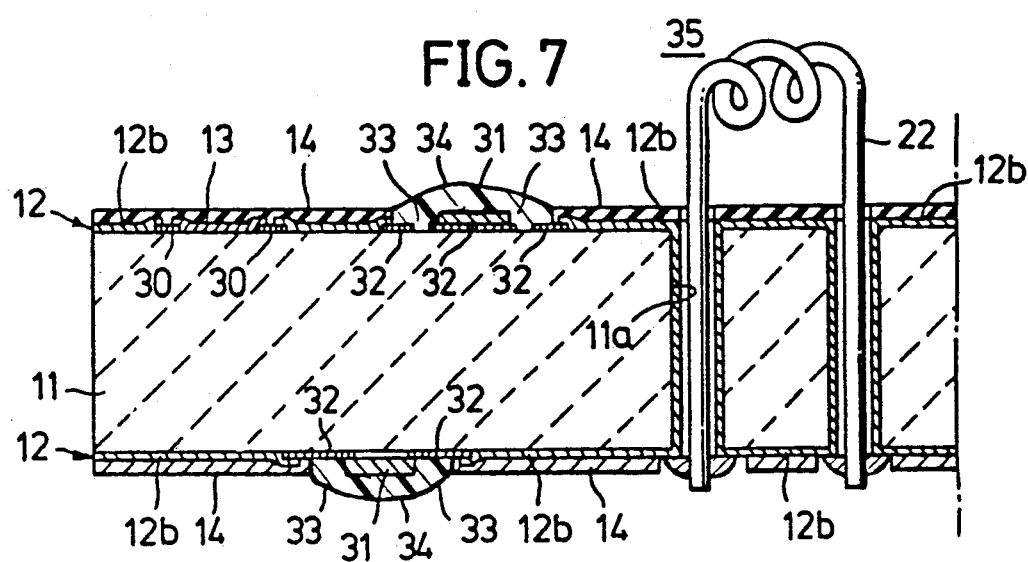
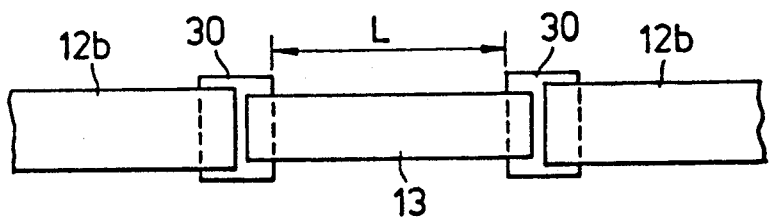
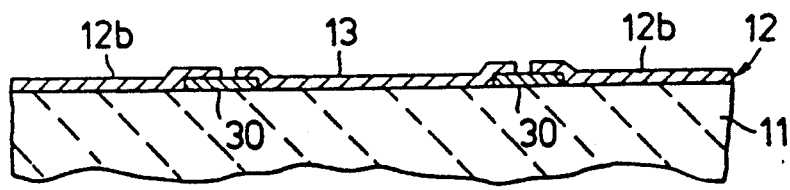
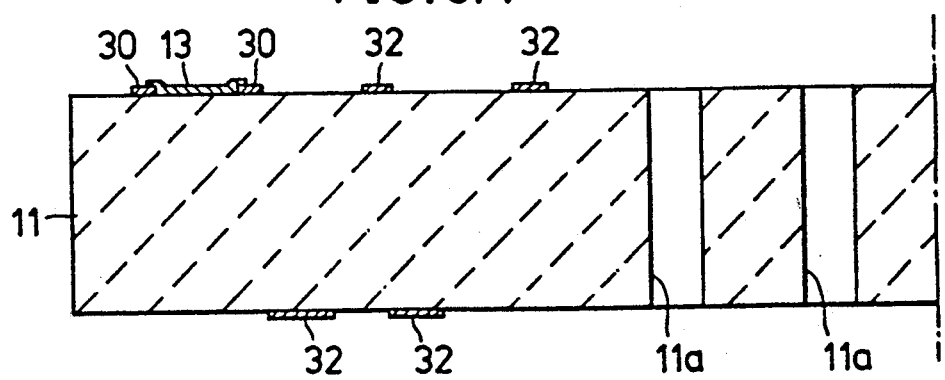

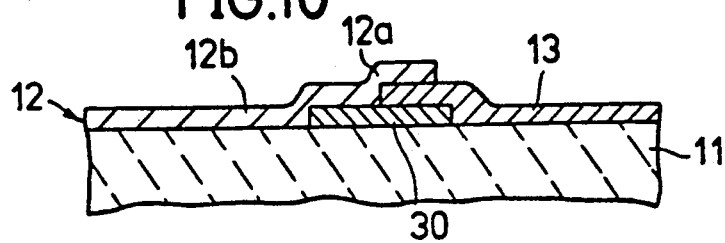
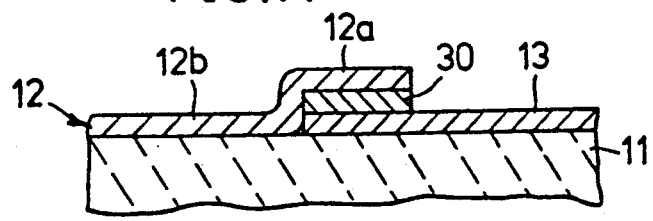
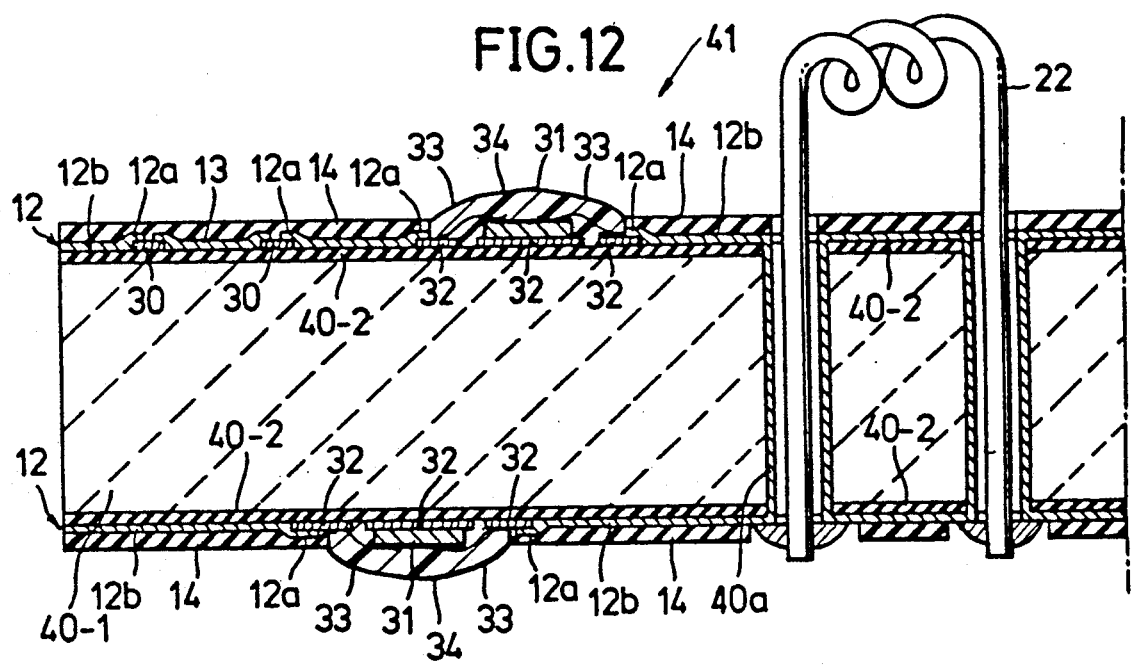

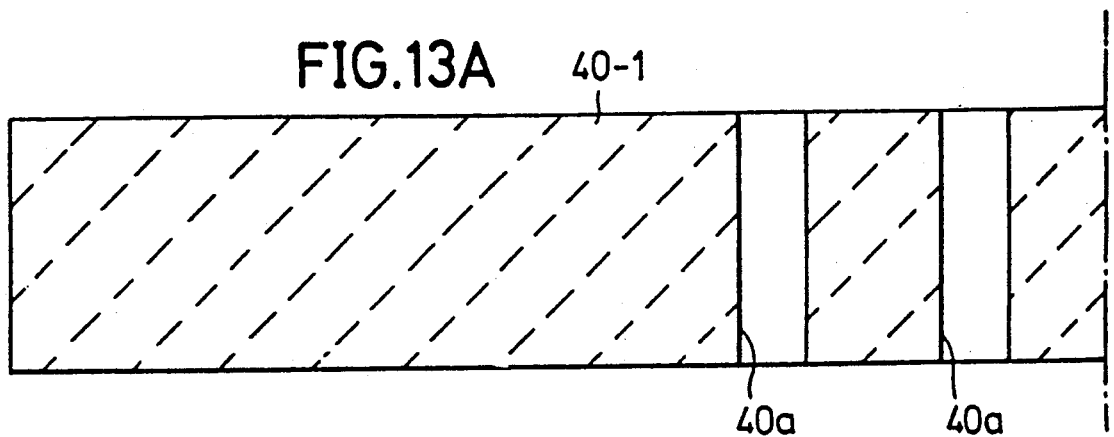
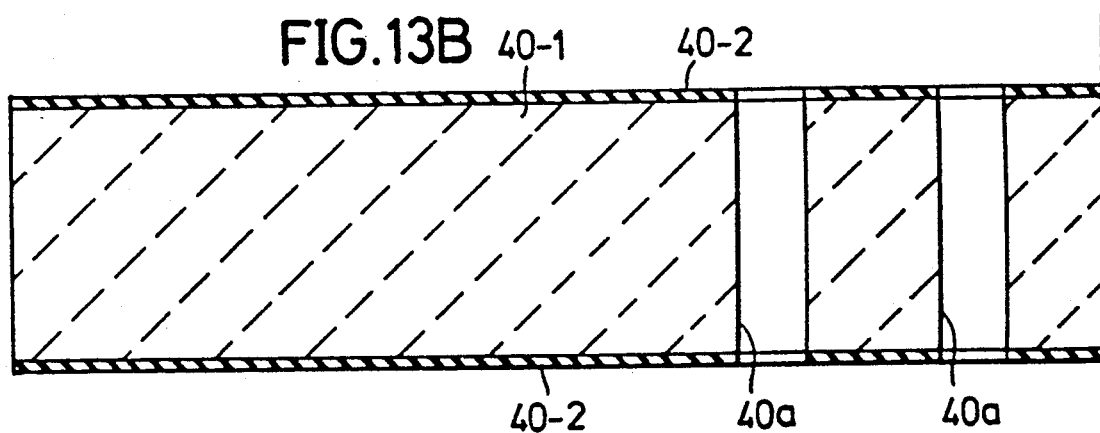
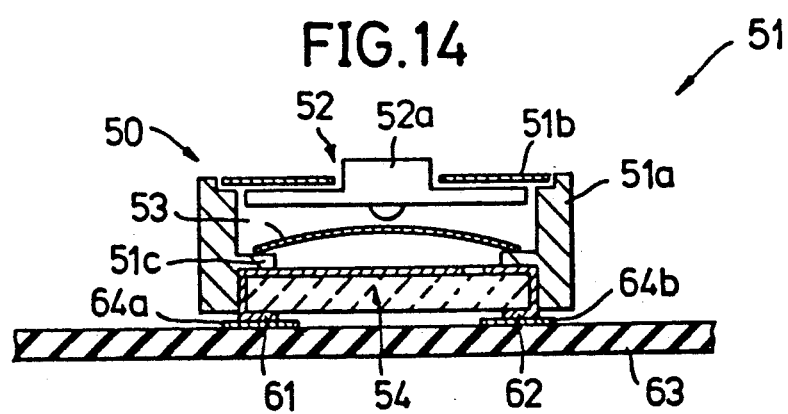

CIRCUIT BOARD AND METHOD OF PRODUCING CIRCUIT BOARD

This is a continuation of co-pending application Ser. No. 07/074,940, filed on July 17, 1987, now abandoned.

BACKGROUND OF THE INVENTION

The present invention generally relates to circuit boards and methods of producing circuit boards, and more particularly to a circuit board used in electronic devices and a method of producing such a circuit board.

Generally, a circuit board comprises an insulating substrate such as a ceramic substrate and a conductor layer formed on the ceramic substrate by use of the thick film technology. However, according to the thick film technology, the printed conductor layer on the ceramic substrate is baked at a high temperature of approximately 850° C. When the circuit board is subjected to a process under such a high temperature, there is a problem in that cracks are easily formed in the conductor layer.

On the other hand, when there is a need to electrically connect two conductor layers formed on opposite sides of the ceramic substrate, it is necessary to provide a conductive pin which penetrates the ceramic substrate and solder both ends of the conductive pin to the respective conductor layers on the ceramic substrate. This is because, even when there is a through hole penetrating the ceramic substrate, the through hole will not be filled with the conductor when the conductor layers are formed on both sides of the ceramic substrate using the thick film technology. As a result, there is a problem in that troublesome processes of inserting the conductive pin into the through hole and soldering the ends of the conductive pin are required in order to electrically connect the two conductor layers on the opposite sides of the ceramic substrate. In other words, the number of parts required and the number processes required increase when such an electrical connection is needed.

SUMMARY OF THE INVENTION

Accordingly, it is a general object of the present invention to provide a novel and useful circuit board and a method of producing a circuit board in which the problems described heretofore are eliminated.

Another and more specific object of the present invention is to provide a circuit board comprising a ceramic substrate, and electrode and wire portions which are formed on the ceramic substrate by selectively removing portions of a conductor layer which is plated on the ceramic substrate. According to the circuit board of the present invention, it is possible to produce the circuit board at a low temperature because the conductor layer is formed by a plating process. In addition, it is possible to reduce the number of parts required and the number of processes required, since a through hole electrode for providing an electrical connection between two conductor layers on opposite sides of the ceramic substrate can be formed by the plating process simultaneously as the formation of the two conductor layers.

Still another object of the present invention is to provide a circuit board comprising a ceramic substrate, a thick film insulator for bonding formed on the ceramic substrate, and a conductor layer which is plated on the thick film insulator. According to the circuit board of the present invention, the bonding strength between the conductor layer and the thick film insulator is strong, and it is possible to prevent premature separation of the conductor layer.

A further object of the present invention is to provide a circuit board comprising a ceramic substrate, a conductor layer plated on the ceramic substrate, and a resistor layer formed on the ceramic substrate with a connecting layer interposed between the conductor layer and the resistor layer at both ends of the resistor layer. According to the circuit board of the present invention, it is possible to obtain a satisfactory electrical contact between the resistor layer and the conductor layer.

Another object of the present invention is to provide a method of producing a circuit board comprising the steps of forming a plated layer on a surface of an insulative ceramic substrate by an electroless plating, plating a conductor layer on the plated layer, and forming electrode and wiring portions by selectively removing portions of the conductor layer. According to the method of the present invention, it is possible to prevent cracks from being forming in the conductor layer during the formation thereof, because the conductor layer is plated at a low temperature. Furthermore, in the case where the ceramic substrate is provided with a through hole, it is possible to form a through hole electrode simultaneously as the formation of the conductor layer.

Other objects and further features of the present invention will be apparent from the following detailed description when read in conjunction with the accompanying drawings.

BRIEF DESCRIPTION OF THE DRAWINGS

FIGS. 3A through 3F are cross sectional views for explaining an embodiment of the method of producing the circuit board shown in FIG. 2;

FIG. 7 is a cross sectional view showing an essential part of a second embodiment of the circuit board according to the present invention;

FIGS. 8A and 8B are a plan view and a cross sectional view of an essential part of the second embodiment on an enlarged scale for explaining a connecting layer;

FIGS. 9A through 9D are cross sectional views for explaining an embodiment of the method of producing the circuit board shown in FIG. 7;

FIGS. 10 and 11 are diagrams for explaining locations of the connecting layer;

FIG. 12 is a cross sectional view showing an essential part of a third embodiment of the circuit board according to the present invention;

FIGS. 13A and 13B are cross sectional views for explaining an embodiment of the method of producing the circuit board shown in FIG. 12;

FIG. 14 is a cross sectional view showing an essential part of a fourth embodiment of the circuit board according to the present invention;

DETAILED DESCRIPTION

Figure 1:
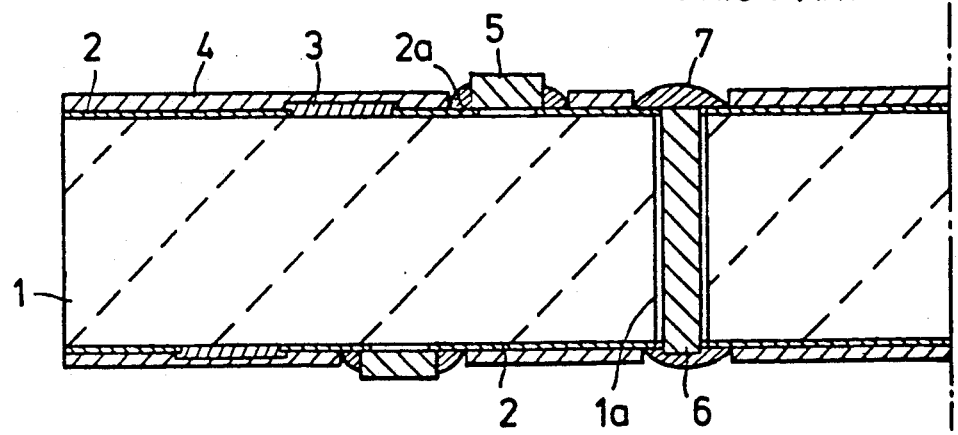
FIG. 1 is a cross sectional view showing an example of the conventional circuit board.

FIG. 1 shows an example of the conventional circuit board. The conventional circuit board comprises an insulating substrate 1 made of ceramics or the like, a through hole 1a penetrating the substrate 1, conductor layers 2 formed on both sides of the substrate 1 by printing silver palladium or the like on the substrate 1 and then baking the substrate 1, resistor layers 3 formed on the substrate 1 by printing ruthenium tetroxide or the like and then baking the substrate 1, insulator layers 5 selectively formed on the conductor layers 2 and the resistor layers 3 for protecting these layers 2 and 3, circuit parts 5 such as capacitor and transistor chips soldered on electrode portions 2a of the conductor layers 2, and a conductive pin 6 which is inserted into the through hole 1a and is soldered on the two conductor layers 2 on both sides of the substrate 1 by solders 7.

The conductor layers 2 are formed on the substrate 1 by use of the thick film technology. However, according to the thick film technology, the printed conductor layer on the substrate 1 is baked at a high temperature of approximately 850° C. When the substrate 1 is subjected to a process under such a high temperature, there is a problem in that cracks are easily formed in the conductor layer 2.

On the other hand, when there is a need to electrically connect two conductor layers 2 formed on opposite sides of the substrate 1, it is necessary to provide the conductive pin 6 which penetrates the substrate 1 and solder both ends of the conductive pin 6 to the respective conductor layers 2 on the substrate 1 as shown in FIG. 1. This is because, even though there is the through hole 1a penetrating the substrate 1, the through hole 1a will not be filled with the conductor when the conductor layers 2 are formed on both sides of the substrate 1 using the thick film technology. As a result, there is a problem in that troublesome processes of inserting the conductive pin 6 into the through hole 1a and soldering the ends of the conductive pin 6 are required in order to electrically connect the two conductor layers 2 on the opposite sides of the substrate 1. In other words, the number of parts required and the number processes required increase when such an electrical connection is needed.

The present invention eliminates the problems of the conventional circuit board by providing a plated conductor layer on a ceramic substrate.

Figure 2:
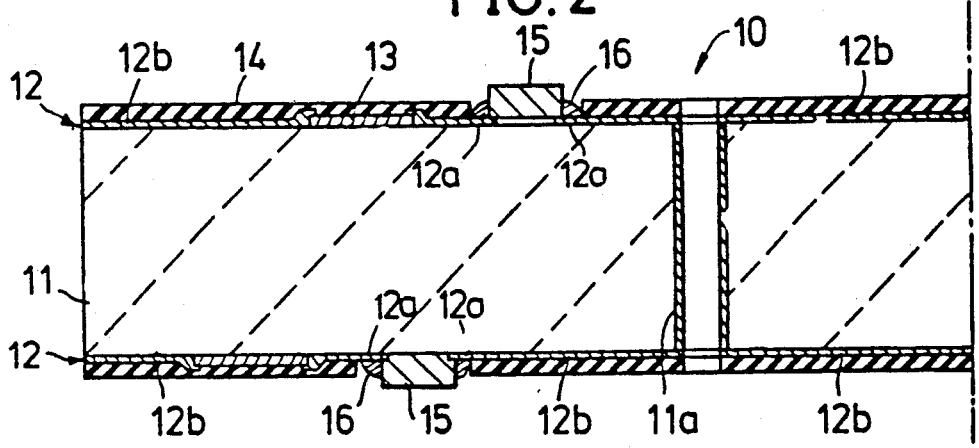
FIG. 2 is a cross sectional view showing an essential part of a first embodiment of the circuit board according to the present invention.

Next, a description will be given on a first embodiment of the circuit board according to the present invention by referring to FIG. 2. A circuit board 10 comprises a ceramic substrate 11 having a through hole 11a, and conductor layers 12 plated on the ceramic substrate 11 and on an inner wall of the through hole 11a. A conductive material such as copper is plated as the conductor layer 12 by a plating process. The circuit board 10 also comprises resistor layers 13 which are formed on the ceramic substrate 11 by printing ruthenium tetroxide, carbon or the like and then baking the ceramic substrate 11, insulator layers 14 selectively formed on the conductor layers 12 and the resistor layers 13 for protecting these layers 12 and 13, and circuit parts 15 such as capacitor and transistor chips soldered on electrode portions 12a of the conductor layers 12 by solders 16.

Next, a description will be given on an embodiment of the method of producing the circuit board 10 by referring to FIGS. 3A through 3F. In FIGS. 3A through 3F, those parts which are the same as those corresponding parts in FIG. 2 are designated by the same reference numerals. The process is carried out on the insulative ceramic substrate 11 having the through hole 11a which penetrates the ceramic substrate 11 as shown in FIG. 3A. A resistor material paste admixed with ruthenium tetroxide is printed on both sides of the ceramic substrate 11 and then baked to form the resistor layers 13 as shown in FIG. 3B. Then, copper is plated on the substrate surfaces, the resistor layers 13 and the inner wall of the through hole 11a at a temperature of approximately 50° C., so as to form the conductor layers 12 as shown in FIG. 3C. The thickness of the conductor layers 12 made of copper is in the range of 20 $\mu$m to 100 $\mu$m. Since the ceramic substrate 11 is insulative and cannot be electroplated directly with copper, a conductor layer (not shown) having a thickness in the order of several $\mu$m is first formed on the ceramic substrate 11 by an electroless plating or a sputtering process, and the conductor layer 12 is actually plated to a predetermined thickness on this conductor layer.

Thereafter, as shown in FIG. 3D, unwanted portions of the conductor layers 12 are removed by an etching process, and a through hole electrode portion 12c is formed. This through hole electrode portion 12c is electrically connected to the electrode portions 12a and wiring portions 12b of the remaining conductor layers 12. Next, as shown in FIG. 3E, the insulator layers 14 for protecting the conductor layers 12 and the resistor layers 13 are formed at portions excluding tops of the electrode portions 12a, by printing and drying an insulator material which constitutes the insulator layers 14. Finally, the circuit parts 15 such as the capacitor and transistor chips are electrically connected to the electrode layers 12 by soldering these circuit parts 15 on the electrode portions 12a of the conductor layers 12 by the solders 16. As a result, the circuit board 10 is produced.

Figure 4:
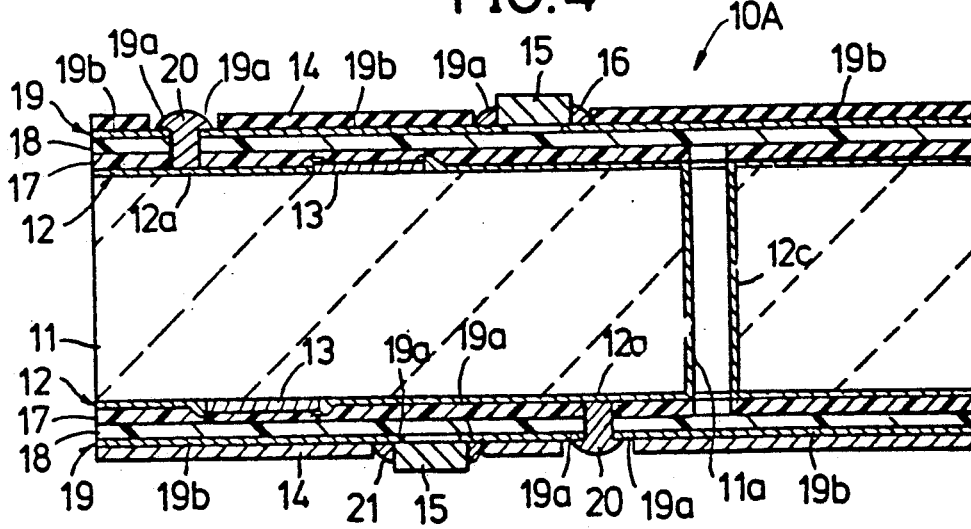
FIGS. 4 through 6 are cross sectional views respectively showing essential parts of modifications of the first embodiment.

FIG. 4 shows an essential part of a first modification of the first embodiment. In FIG. 4, those parts which are the same as those corresponding parts in FIG. 2 are designated by the same reference numerals, and a description thereof will be omitted. In FIG. 4, a circuit board 10A additionally comprises adhesive layers 17 and insulator films 18 formed on the adhesive layers 17. The insulator films 18 are made of a synthetic resin such as polyimide resins having high heat resistance and high electrical insulation. Second conductor layers 19 are formed on the insulator films 18, and the second conductor layers 19 have electrode portions 19a and wiring portions 19b. Solders 20 electrically connect the electrode portions 12a of the first conductor layers 12 to the electrode portions 19a of the second conductor layers 19. The insulator layers 14 protect the second conductor layers 19 excluding the electrode portions 19a thereof.

Next, a brief description will be given on the processes of producing the circuit board 10A. The resistor layers 13 and the first conductor layers 12 are formed on the ceramic substrate 11 by processes identical to those of the first embodiment described before. Then, the second conductor layer 19 is fixed on the insulator film 18, and the adhesive layer 17 is coated on one side of the insulator film 18 not fixed with the second conductor layer 19. A composite member unitarily comprising the second conductor layer 19, the insulator film 18 and the adhesive layer 17 is adhered on top of the first conductor layers 12 on both sides of the ceramic substrate 11. Thereafter, the insulator layers 14 are formed on the second conductor layers 19 excluding the electrode portions 19a, by printing and drying the insulator material which constitutes the insulator layers 14. Finally, the solders 20 are formed to electrically connect the first and second conductor layers 12 and 19, and the circuit parts 15 are soldered on the electrode portions 19a. As a result, the circuit board 10A is produced.

In this first modification of the first embodiment, the present invention is applied to a circuit board having multiple layers.

Figure 5:
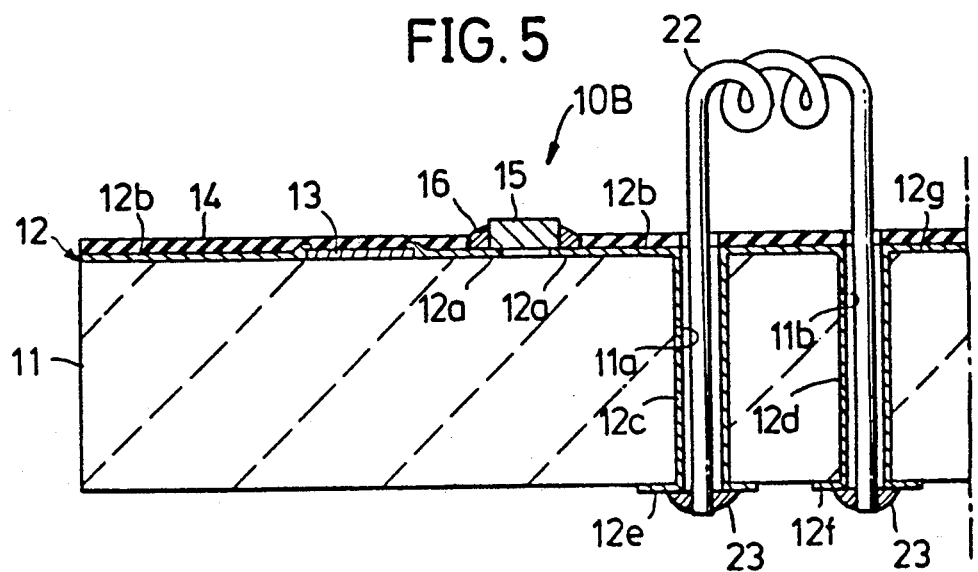

FIG. 5 shows an essential part of a second modification of the first embodiment. In FIG. 5, those parts which are the same as those corresponding parts in FIG. 2 are designated by the same reference numerals, and a description thereof will be omitted. In FIG. 5, a circuit board 10B comprises through holes 11a and 11b. Through hole electrode portions 12c and 12d are formed on respective inner walls of the through holes 11a and 11b simultaneously as the plating of the conductor layers 12. Hence, the through hole electrode portion 12c is continuous with the wiring portion 12b and an electrode portion 12e on the lower surface of the ceramic substrate 11, and the through hole electrode portion 12d is continuous with a wiring portion 12g and an electrode portion 12f on the lower surface of the ceramic substrate 11. A circuit part 22 such as a coil comprises two leads, and the two leads are soldered on the respective electrode portions 12e and 12f by solders 23.

Next, a brief description will be given on the processes of producing the circuit board 10B. The processes of forming the resistor layer 13, the conductor layers 12 and the insulator layer 14 on the ceramic substrate 11 and soldering the circuit part 15 on the electrode portion 12a of the conductor layer 12 are identical to those of the first embodiment described before except that the resistor layer 13 is only formed on the upper surface of the ceramic substrate 11. Then, the leads of the circuit part 22 are inserted into the respective through holes 11a and 11b, and the tip ends of the leads are soldered on the respective electrode portions 12e and 12f by the solder 23. As a result, the circuit board 10B is produced.

This second modification of the first embodiment is especially suited to applications where the circuit parts 15 and 22 are provided on only the upper surface of the ceramic substrate 11.

Figure 6:
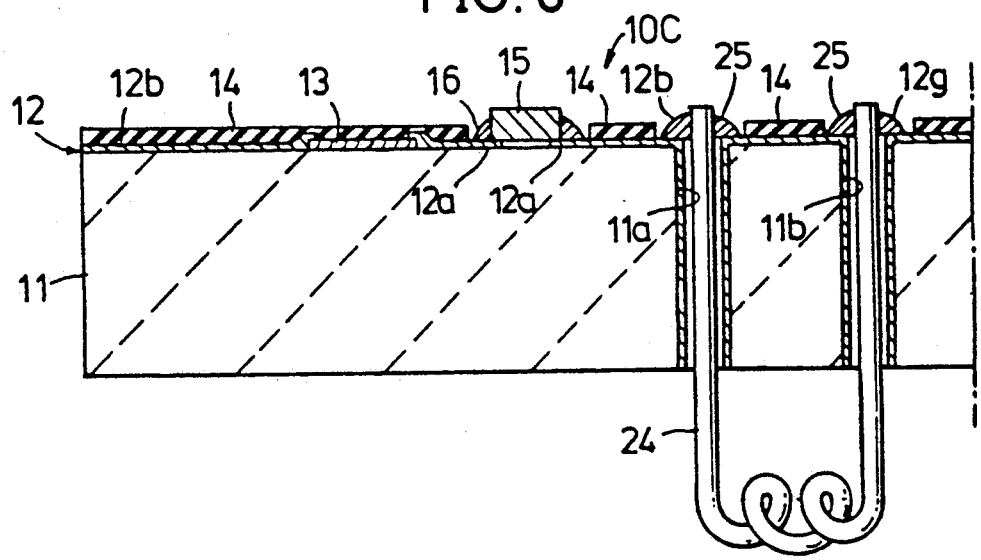

FIG. 6 shows an essential part of a third modification of the first embodiment. In FIG. 6, those parts which are the same as those corresponding parts in FIG. 5 are designated by the same reference numerals, and a description thereof will be omitted. In FIG. 6, a circuit board 10C comprises a circuit part 24 such as a coil. Leads of the circuit part 24 are inserted through the respective through holes 11a and 11b, and the tip ends of the leads are soldered on the respective wiring portions 12b and 12g of the conductor layer 12 by solders 25.

Next, a brief description will be given on the processes of producing the circuit board 10C. The processes of forming the resistor layer 13, the conductor layers 12 and the insulator layer 14 on the ceramic substrate 11 and soldering the circuit part 15 on the electrode portion 12a of the conductor layer 12 are identical to those of the second modification of the first embodiment described before. Then, the leads of the circuit part 24 are inserted into the respective through holes 11a and 11b, and the tip ends of the leads are soldered on the wiring portions 12b and 12g by the solders 25, simultaneously as the solding of the circuit part 15 by the solder 16. As a result, the circuit board 10C is completed.

This third modification of the first embodiment is advantageous from the point of view of simplifying the production process in that the circuit parts 14 and 25 can be simultaneously dip soldered on the corresponding portions (12a, 12b, 12g) of the conductor layer 12.

According to the first embodiment and the modifications thereof, there is no need to bake the ceramic substrate 11 when forming the conductor layers 12 since the conductor layers 12 are plated. Hence, it is possible to prevent cracks from being formed in the conductor layers 12 due to the baking conventionally required for the formation of the conductor layers 12. In addition, the through hole electrode portions 12c and 12d are formed simultaneously as the formation of the conductor layers 12. Therefore, it is possible to minimize the number of parts required and minimize the number of production processes for producing the circuit board (10, 10A, 10B, 10C).

However, according to the first embodiment and the modifications thereof, it is difficult to obtain a satisfactory electrical connection between the resistor layer 13 which is formed on the ceramic substrate 11 by the thick film technology and the conductor layer 12 which is formed on the ceramic substrate 11 and on a portion of the resistor layer 13 by plating copper. The resistance at this junction between the two layers 13 and 12 may be abnormally high, and it is difficult to obtain the desired resistance.

Next, a description will be given on a second embodiment of the circuit board according to the present invention which eliminates the above described problems of the first embodiment and the modifications thereof, by referring to FIG. 7. In FIG. 7, those parts which are the same as those corresponding parts in FIGS. 2 through 6 are designated by the same reference numerals, and a description thereof will be omitted. In FIG. 7, a circuit board 35 comprises a connecting layer 30 which is formed on the ceramic substrate 11 by printing silver palladium or the like and then baking the ceramic substrate 11. This connecting layer 30 constitutes an essential part of the present embodiment. The circuit board 35 also comprises electrode portions 32 and integrated circuit (IC) chips 31 which are wire-bonded on the electrode portions 32 by wires 33. The electrode portions 31 are connected to the conductor layers 12 and are formed on the ceramic substrate 11 by printing gold and then baking the ceramic substrate 11. The circuit parts (not shown) such as the capacitor and transistor chips are also soldered on the electrode portions of the conductor layers 12. Resin layers 34 are formed over the IC chips 31 and vicinities thereof so as to protect the IC chips 31.

FIGS. 8A and 8B show the connection between the conductor layer 12 and the resistor layer on an enlarged scale. As shown in FIGS. 8A and 8B, the resistor layer 13 and the conductor layer 12 are not connected directly, and the connecting layer 30 made of silver palladium connects the two layers 13 and 12 at two locations on both ends of the resistor layer 13. In the present embodiment, the connecting layer 30 made of the silver palladium is provided between the resistor layer 13 and the conductor layer 12. The bonding strength at the connection of the resistor layer 13 and the conductor layer 12 is improved by the provision of the connecting layer 30, and the electrical connection between the two layers 13 and 12 is also improved.

It may be regarded that the improvements in the bonding strength and the electrical connection at the connection of the resistor layer 13 and the conductor layer 12 are brought about for the following reasons. Before the connecting layer 30 made of the silver palladium is baked, the connecting layer 30 is still in the paste form in which the silver palladium powder, glass powder and the like are admixed. The connecting layer 30 in this paste form is printed on the ceramic substrate 11 by a known printing process, and then baked after the connecting layer 30 in the paste form is dried. When the connecting layer 30 in the paste form is baked, fine irregularities are formed on the surface of the connecting layer 30 due to the so-called anchor effect. This anchor effect does not occur during the baking in all the materials which are formed by the thick film technology, and occurs only when the paste which is baked is admixed with predetermined materials. For example, the anchor effect does not occur when the paste admixed with the ruthenium tetroxide, carbon and the like, such as that used for the resistor layer 13, is baked.

When the copper which becomes the conductor layer 12 is plated on this connecting layer 30 on which the anchor effect has occurred, the plated copper is strongly bonded on the surface of the connecting layer 30 having the fine irregularities, and satisfactory electrical connection and bonding are obtained between the conductor layer 12 and the connecting layer 30. The effective bonding area between the conductor layer 12 and the connecting layer 30 is large because of the fine irregularities on the surface of the connecting layer 30, and it may be regarded that this factor also contributes to the improved electrical connection between the two layers 12 and 30.

According to experiments performed by the present inventors, materials such as silver platinum (AgPt), silver (Ag), platinum (Pt), palladium (Pd), gold (Au) and the like may be used for the connecting layer 30 in order for the anchor effect to occur, so that the satisfactory electrical connection and bonding are obtainable between the conductor layer 12 and the connecting layer 30.

In the case where the resistivity of the resistor layer 13 is constant, the resistance of the resistor layer 13 is determined by a separating distance L shown in FIG. 8A between the two connecting layers 30. Because the two connecting layers 30 can be formed so that a desired separating distance is formed therebetween with a high accuracy, it is possible to obtain the desired resistance for the resistor layer 13 with ease.

Figure 9B:
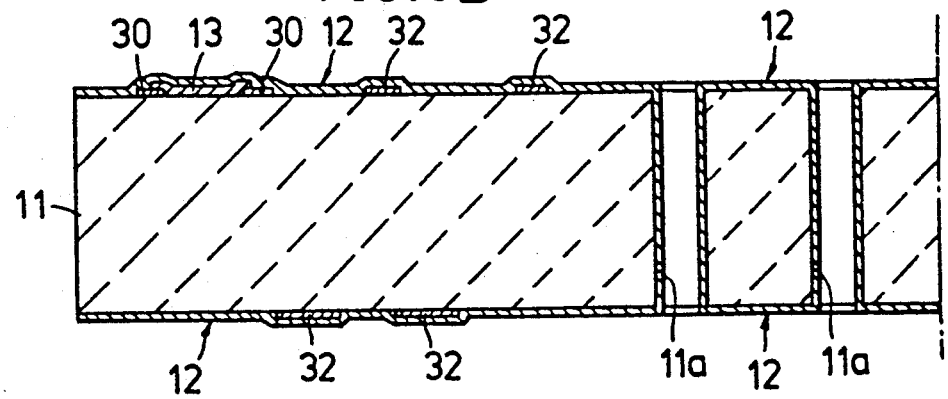

Next, a description will be given on an embodiment of the method of producing the circuit board 35, by referring to FIGS. 9A through 9D. In FIGS. 9A through 9D, those parts which are the same as those corresponding parts in FIG. 7 are designated by the same reference numerals, and a description thereof will be omitted. First, a paste admixed with silver palladium and a paste admixed with gold are printed at predetermined positions on the ceramic substrate 11 which has the through holes 11a, and the pastes are dried at approximately 150° C. Then, a paste admixed with ruthenium tetroxide is printed on the ceramic substrate 11 across two dried pastes admixed with the silver palladium. Thereafter, the ceramic substrate 11 is baked at approximately 850° C., and the connecting layer 30, the resistor layer 13 and the electrode portions 32 are formed on the ceramic substrate 11 as shown in FIG. 9A. The resistor layer 13 is melted and connects to the connecting layer 30 with a strong bonding strength, and the electrical connection between the resistor layer 13 and the connecting layer 30 is satisfactory.

Next, copper is plated on the ceramic substrate 11 at a temperature of approximately 50° C., so as to cover the substrate surface, the inner walls of the through holes 11a, the connecting layer 30, the resistor layer 13 and the electrode portions 32 by the copper conductor layers 12 as shown in FIG. 9B. The thickness of the plated conductor layers 12 is in the range of 20 $\mu$m to 100 $\mu$m. Since the ceramic substrate 11 is insulative and cannot be electroplated directly with copper, a conductor layer (not shown) having a thickness in the order of several $\mu$m is first formed on the ceramic substrate 11 by an electroless plating or a sputtering process, and the conductor layer 12 is actually plated to a predetermined thickness on this conductor layer.

Figure 9C:
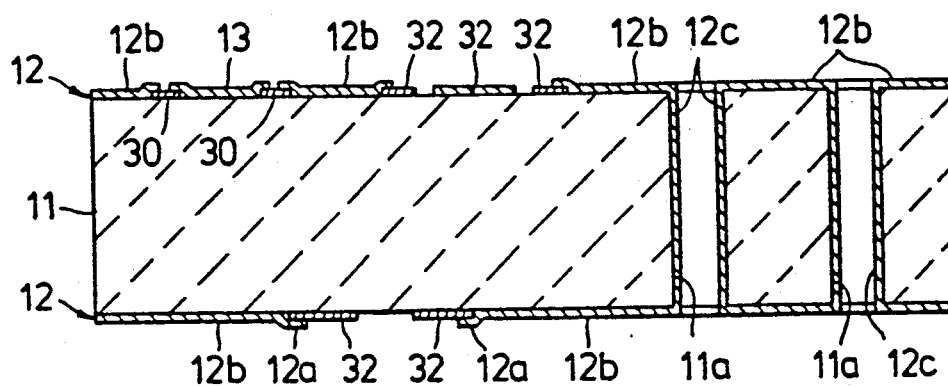
Figure 9D:
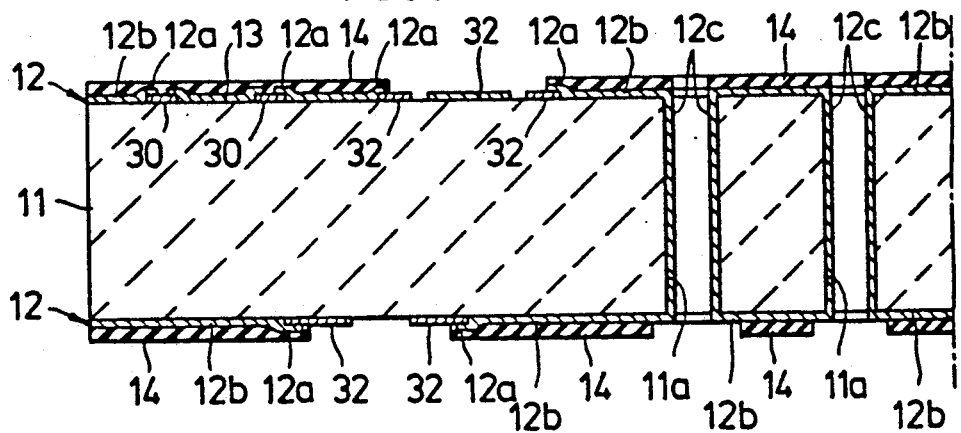

Then, as shown in FIG. 9C, unwanted portions of the conductor layers 12 are removed by an etching process, and predetermined patterns of the conductor layers 12 are formed on the substrate surface. When the conductor layers 12 are plated, the through hole electrode portions 12c are also formed on the inner walls of the through holes 11a, simultaneously as the formation of the conductor layers 12.

Thereafter, the insulator layers 14 for protecting the resistor layer 13 and the conductor layers 12 are printed on top of the layers on the ceramic substrate 11 excluding the electrode portions 32 and then dried. The IC chips 31 are mounted on the electrode portions 32 as shown in FIG. 7 by wire-bonding, and the circuit parts such as the capacitor and transistor chips are soldered on the electrode portions of the conductor layers 12. Furthermore, the resin layer 34 is formed to protect the IC chips 31 and the electrode portions 32. As a result, the circuit board 35 is produced.

In the present embodiment, the arrangement of the connecting layer 30 between the resistor layer 13 and the conductor layer 12 is not limited to that shown in FIG. 8B. For example, the resistor layer 13 and the conductor layer 12 may overlap on top of the connecting layer 30 as shown in FIG. 10. In addition, the connecting layer 30 may be sandwiched between the resistor layer 13 and the conductor layer 12 as shown in FIG. 11.

According to the first and second embodiments and the modifications thereof, there is no need to bake the ceramic substrate 11 when forming the conductor layers 12 since the conductor layers 12 are plated. Hence, it is possible to prevent cracks from being formed in the conductor layers 12 due to the baking conventionally required for the formation of the conductor layers 12. In addition, the through hole electrode portions 12c and 12d are formed simultaneously as the formation of the conductor layers 12. Therefore, it is possible to minimize the number of parts required and minimize the number of production processes for producing the circuit board (10, 10A, 10B, 10C, 35).

Furthermore, according to the second embodiment, it is possible to obtain a satisfactory bonding between the resistor layer 13 which is formed on the ceramic substrate 11 by the thick film technology and the conductor layer 12 which is formed on the resistor layer 13 (and on the ceramic substrate 11) by plating copper, due to the provision of the connecting layer 30.

However, according to the first and second embodiments and the modifications thereof, the bonding strength between the ceramic substrate 11 and the conductor layer 12 is weak, and the conductor layer 12 may easily separate from the ceramic substrate 11. The easy separation of the conductor layer 12 from the ceramic substrate 11 is mainly due to the extremely smooth surface of the ceramic substrate 11 owing to a roll forming process used to produce the ceramic substrate 11. It is extremely difficult to obtain a strong bonding between the extremely smooth substrate surface and the conductor layer 12 which is plated on the substrate surface.

Next, a description will be given on a third embodiment of the circuit board according to the present invention which eliminates the above described problems of the first and second embodiments and the modifications thereof, by referring to FIG. 12. In FIG. 12, those parts which are the same as those corresponding parts in FIGS. 2 through 11 are designated by the same reference numerals, and a description thereof will be omitted.

In FIG. 12, a circuit board 41 comprises a ceramic substrate 40-1 which is made of alumina, for example, and this ceramic substrate 40-1 has through holes 40a. The ceramic substrate 40-1 is produced by forming alumina powder into a predetermined shape and subjecting it to a baking process, and the surfaces of the ceramic substrate 40-1 are extremely smooth. Insulative bonding layers 40-2 which constitute an essential part of the present embodiment are formed on both sides of the ceramic substrate 40-1. The insulative bonding layers 40-2 have a thickness of approximately 20 μm to 50 μm. The insulative bonding layers 40-2 are also made of the same alumina constituting the ceramic substrate 40-1, and as will be described layer, the insulative bonding layers 40-2 are formed by printing alumina powder paste on the ceramic substrate 40-2 and then baking the ceramic substrate 40-1. When the ceramic substrate 40-1 is baked, the anchor effect described before occurs at the surfaces of the insulative bonding layers 40-2, and fine irregularities are formed at the surfaces of the insulative bonding layers 40-2. The connecting layer 30, the resistor layer 13, the conductor layer 12, the insulator layer 14, the IC chip 31 and the like are provided on the insulative bonding layer 40-2.

Next, a description will be given on the bonding between the bonding layer 40-2 and the conductor layer 12. When the conductor layer 12 is placed directly on the ceramic substrate 40-1 as described above, the bonding strength between the plated conductor layer 12 and the ceramic substrate 40-1 will be weak, and the plated conductor layer 12 will easily separate from the ceramic substrate 40-1. However, according to the circuit board 41 of the present embodiment, it is possible to improve the bonding strength of the conductor layer 12 with respect to the ceramic substrate 40-1 to approximately 2.0 kg/mm² from the conventional bonding strength of approximately 0.75 kg/mm². It may be regarded that this improvement in the bonding strength is obtained for the following reasons.

The bonding layer 40-2 is a paste admixed with alumina powder, glass powder and the like before it is baked. This paste is printed on the ceramic substrate 40-1 by a known printing process and is thereafter dried. When this paste on the ceramic substrate 40-1 is dried, fine irregularities are formed at the surface of the bonding layer 40-2 due to the anchor effect described before.

When the copper which becomes the conductor layer 12 is placed on this bonding layer 40-2 on which the anchor effect has occurred, the plated copper is strongly bonded on the surface of the bonding layer 40-2 having the fine irregular depressions and projections, and a satisfactory bonding is obtained between the conductor layer 12 and the bonding layer 40-2. As a result, it is possible to prevent premature separation of the conductor layer 12 from the ceramic substrate 40-1.

The ceramic substrate 40-1 and the bonding layer 40-2 are made of the same material, and for this reason, the bonding strength therebetween is strong. The fine irregularities are extensively formed at the surface of the bonding layer 40-2 when the admixed quantity of the alumina constituting the bonding layer 40-2 is decreased, but the fine processing of the conductor layer 12, the resistor layer 13 and the like becomes difficult in this case. Accordingly, it is desirable to set the admixed quantity of the alumina to such an appropriate value that the fine processing of these layers is possible, and the admixed quantity of the alumina may be identical to that of the ceramic substrate 40-1. Since the coefficient of thermal expansion of the bonding layer 40-2 is the same as that of the ceramic substrate 40-1, the bonding layer 40-2 will not easily separate from the ceramic substrate 40-1 even when the ceramic substrate 40-1 is subjected to a baking process and the like.

Next, a brief description will be given on an embodiment of the method of producing the circuit board 41 by referring to FIGS. 13A and 13B. In FIGS. 13A and 13B, those parts which are the same as those corresponding parts in FIG. 12 are designated by the same reference numerals. In FIG. 13A, the ceramic substrate 40-1 has the through holes 40a which penetrate the ceramic substrate 40-1. A paste admixed with alumina powder, glass powder and the like is printed on both sides of this ceramic substrate 40-1. The same alumina powder used for the ceramic substrate 40-1 is used in the paste which is printed on the substrate surface. The ceramic substrate 40-1 printed with the paste is dried at a temperature of approximately 150° C., for example, and is then baked. As a result, the bonding layer 40-2 is formed on the ceramic substrate 40-1 as shown in FIG. 13B. The ceramic substrate 40-1 and the bonding layer 40-2 are made of the same material, and for this reason, the bonding strength therebetween is strong. The fine irregularities are formed at the surface of the bonding layer 40-2 due to the anchor effect.

The processes of successively forming or mounting the connecting layer 30, the electrode portion 32, the resistor layer 13, the conductor layer 12, the insulator layer 14, the IC chip 31, the circuit part 22 and the like are the same as those described before in conjunction with FIGS. 9A through 9D, and for this reason, a description on these processes will be omitted.

According to the third embodiment, the conductor layer 12 of the circuit board 41 is plated on the bonding layer 40-2 having the fine irregularities at the surface thereof due to the anchor effect. For this reason, the bonding strength between the conductor layer 12 and the bonding layer 40-2 is strong, and it is possible to positively prevent the conductor layer 12 from separating from the bonding layer 40-2. Therefore, the reliability of the circuit board 41 is improved.

Next, a description will be given on a fourth embodiment of the circuit board according to the present invention. In the present embodiment, the present invention is applied to a circuit board having a switch.

For example, a conventional miniature push switch which is mounted on a printed circuit board is constituted by a push button, a flexible contact piece, a contact substrate and the like. A pair of electrode patterns made of copper, for example, is formed on the contact substrate with a predetermined pattern. The flexible contact piece is bent and simultaneously makes contact with the pair of electrode patterns when the push button is pushed, and the miniature push switch is closed in this state.

However, according to the conventional miniature push switch, the electrode patterns are formed only on the upper surface of the contact substrate. For this reason, in order to have an electrical connection to the electrode patterns on the outside of a switch case of the miniature push switch, it is necessary to provide independent lead wires. As a result, the number of parts required increase and the assembling process becomes complex. In addition, when mounting the miniature push switch on the upper surface of the circuit board, the lead wires must be inserted into through holes of the circuit board and be soldered onto corresponding terminals on the lower surface of the circuit board. Therefore, there is a problem in that the production efficiency of the conventional circuit board mounted with the miniature push switch is poor.

In the fourth embodiment, a push switch 50 shown in FIG. 14 uses the circuit board according to the present invention to eliminate the above described problems. In FIG. 14, the push switch 50 generally comprises a case 51, a push button 52, a flexible contact piece 53, a contact substrate 54, and the like. The case 51 comprises a main case body 51a and a lid portion 51b, and a flange portion 51c is formed at an inner central portion of the main case body 51a. The flexible contact piece 53 which is made of a conductive material and has a curved shape is placed on top of the flange portion 51c. The push button 52 is arranged on top of the flexible contact piece 53, and a manipulating portion 52a of the push button 52 is exposed through a central hole in the lid portion 51b of the case 51. The contact substrate 54 which constitutes an essential part of the present embodiment is mounted under the flange portion 51c of the case 51.

Figure 15:
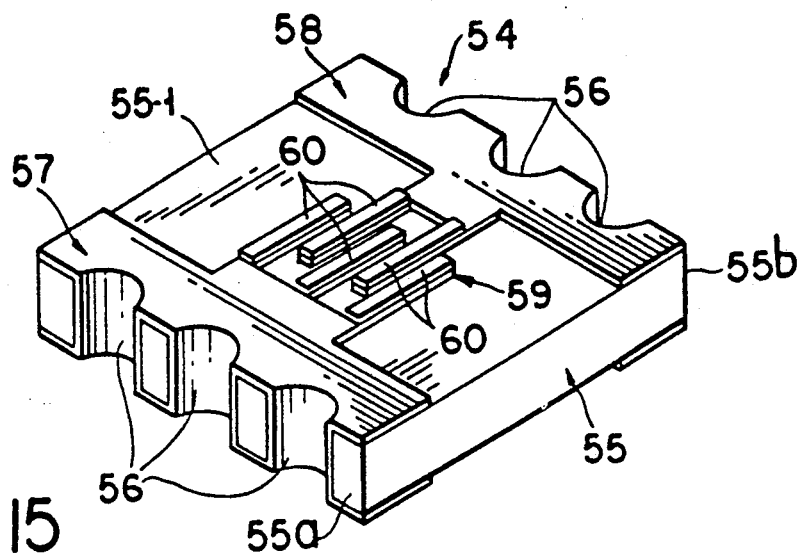
FIGS. 15 and 16 are perspective views showing a contact substrate.
Figure 16:
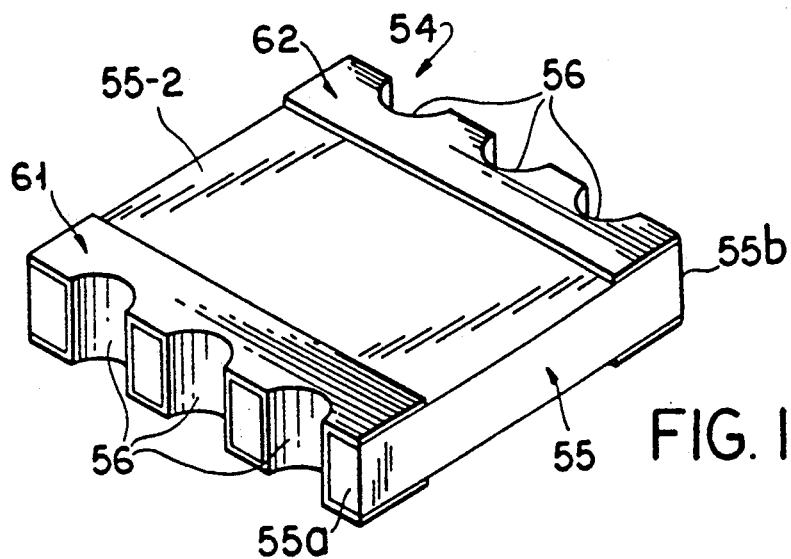

FIG. 15 shows the contact substrate 54 on an enlarged scale. In FIG. 15, the contact substrate 54 comprises a ceramic (alumina) substrate 55, and semi-circular grooves 56 formed on side surfaces 55a and 55b of the ceramic substrate 55. The grooves 56 may be curved or rectangular. As shown, a conductor pattern 57 is formed on the semi-circular grooves 56 and on top and bottom surfaces 55-1 and 55-2 in the vicinity of the side surface 55a, and a conductor pattern 58 is formed on the semi-circular grooves 56 and on the top and bottom surfaces 55-1 and 55-2 in the vicinity of the side surface 55b. The bottom surface 55-2 is shown in FIG. 16. A description on the processes of forming the conductor patterns 57 and 58 will be given later.

The conductor patterns 57 and 58 are electrically insulated from each other and have contact portions 59 at the central portion on the upper surface 55-1. The contact portions 59 include narrow conductor strips extending from the conductor pattern 57 and narrow conductor strips extending from the conductor pattern 58, and these narrow conductor strips are arranged parallel to each other. The flexible contact piece 53 makes contact with the contact portions 59, so as to electrically connect the conductor patterns 57 and 58 and close the push switch 50. Carbon 60 is coated on the narrow conductor strips of the conductor patterns 57 and 58, so as to prevent premature frictional wear of the narrow conductor strips due to contact with the flexible contact piece 53.

A more detailed description will now be given on the side surfaces 55a and 55b of the ceramic substrate 55. As shown in FIGS. 15 and 16, the conductor patterns 57 and 58 are also formed within the semi-circular depressions 56 at the side surfaces 55a and 55b and integrally comprise lead portions 61 and 62 on the bottom surface 55-2. In other words, the contact portions 59 on the top surface 55-1 are drawn out to the bottom surface 55-2 through the side surfaces 55a and 55b. Accordingly, the lead portions 61 and 62 on the bottom surface 55-2 may be used as connecting terminals for electrical connection with an external electrical circuit.

Returning now to the description of FIG. 14, the contact substrate 54 is mounted on the case 51 so that the lead portions 61 and 62 are exposed at the bottom of the push switch 50. The case 51 may have side surfaces with projections in correspondence with the semi-circular grooves 56 so as to obtain a satisfactory fitting. When electrically connecting the push switch 50 to electrode portions 64a and 64b formed on a printed circuit board 63, solder bumps are pre-formed on the lead portions 61 and 62 and the solder bumps are soldered on the electrode portions 64a and 64b which are pre-soldered. The process of mounting the contact substrate 54 on the case 51 is extremely simple compared to the conventional process of inserting lead wires into the through holes of the printed circuit board and soldering the lead wires to corresponding terminals of the printed circuit board, and the production efficiency is improved. In addition, as will be described later, the formation of the lead portions 61 and 62 is simple in that the lead portions 61 and 62 are formed simultaneously as the formation of the conductor patterns 57 and 58. It is also possible to reduce the number of parts required because there is no need to provide lead wires as in the case of the conventional switch.

Figure 17:
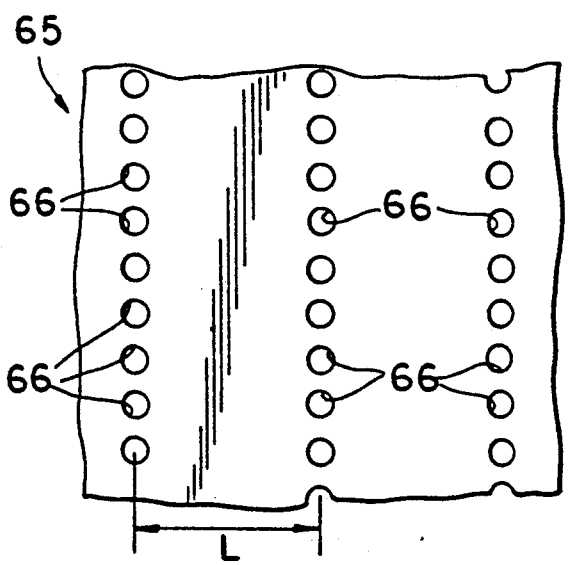
FIGS. 17 through 20 are plan views for explaining the processes of producing the contact substrate.

Next, a description will be given on the process of producing the contact substrate 54. A plurality of contact substrates 54 are formed from a ceramic substrate 65 having a large area as shown in FIG. 17. A plurality of holes 66 are formed in the ceramic substrate 65 so that a hole 66 in one column of the holes 66 is separated by a distance L from a hole 66 in an adjacent column of the holes 66, where the distance L corresponds to the width of the contact substrate 54. The holes 66 are formed in the raw sheet before the baking of the ceramic substrate 65.

The ceramic substrate 65 formed with the holes is plated in its entirety with (Sn+Pd) by an electroless plating, and is thereafter plated in its entirety with copper by an electroplating. Accordingly, a copper film having a predetermined thickness covers the entire surface of the ceramic substrate 65. The copper film is also formed on the inner walls of the holes 66, and the copper film on the upper surface of the ceramic substrate 65 is electrically connected to the copper film formed on the lower surface of the ceramic substrate 65 through the copper film formed on the inner walls of the holes 66. The ceramic substrate 65 covered by the copper film is then subjected to a resist applying process and an etching process, and predetermined copper patterns 67 are formed on the substrate surface as shown in FIG. 18.

Figure 18:
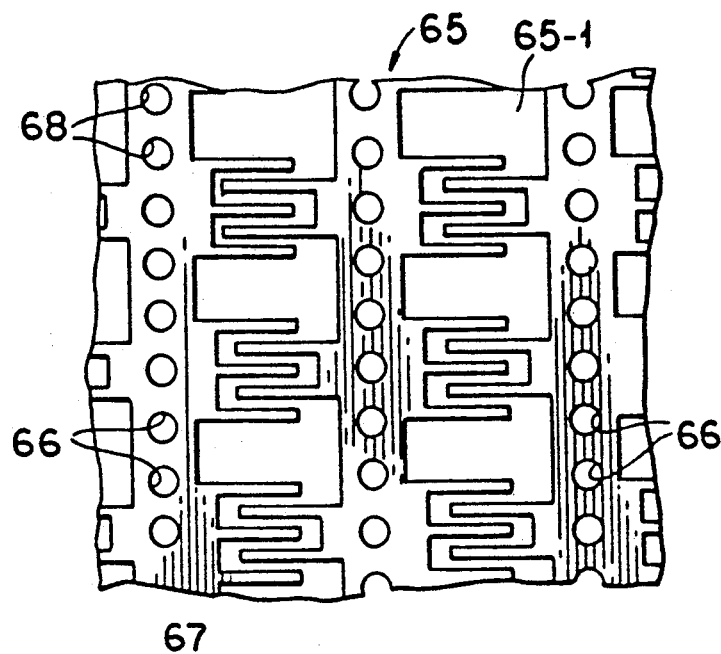
Figure 19:
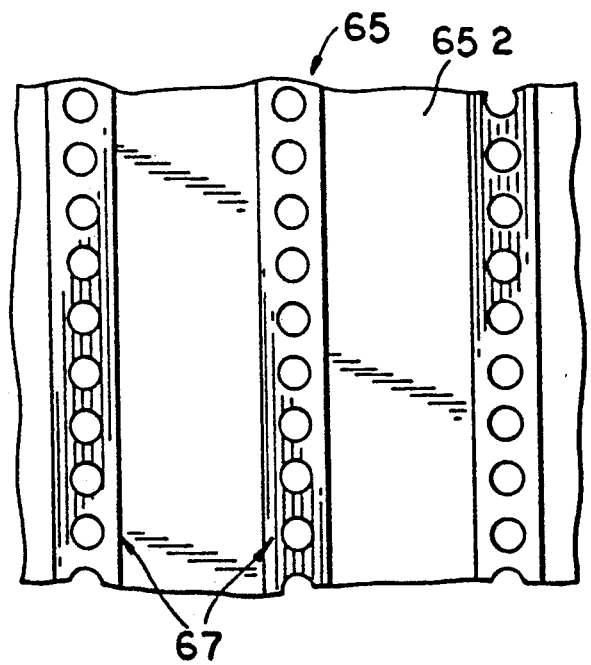

FIG. 18 shows the copper patterns 67 formed on an upper surface 65-1 of the ceramic substrate 65 and corresponding to the conductor patterns 57 and 58. On the other hand, FIG. 19 shows the copper patterns 67 formed on a lower surface 65-2 of the ceramic substrate 65 and corresponding to the lead portions 61 and 62.

Silver is plated on top of the copper patterns 67 so as to protect the copper film. Furthermore, carbon 68 is coated on portions of the copper patterns 67 corresponding to the contact portions 59, as indicated by hatchings in FIG. 20. The carbon 68 prevents premature frictional wear of the contact portions 59 shown in FIG. 15 due to the repeated manipulation of the switch 50.

Figure 20:
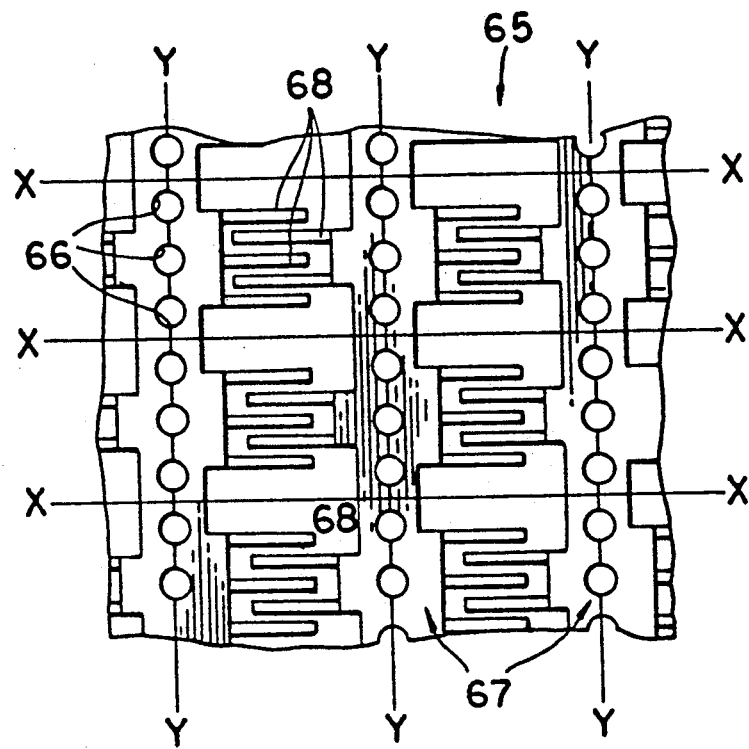

Finally, the ceramic substrate 65 subjected to the processes described heretofore is then cut along lines X—X and Y—Y shown in FIG. 20, and the contact substrates 54 identical to the contact substrate 54 shown in FIGS. 15 and 16 are obtained.

Since the plurality of the contact substrates 54 are produced simultaneously from the ceramic substrate 65, the production efficiency of the contact substrate 54 is high. Furthermore, because the copper film is also formed on the inner walls of the holes 66 during the copper plating process, the holes 66 function as through hole electrodes. Hence, the copper pattern 67 formed on the upper surface 65-1 of the ceramic substrate 65 and the copper pattern 67 formed on the lower surface 65-2 of the ceramic substrate 65 are continuous and are electrically connected through the holes 66 which function as the through hole electrodes. For this reason, the lead portions 61 and 62 may be used as the conventional lead wires for electrical connection with the external printed circuit board 63, and there is no need to provide special lead wires or the like for the electrical connection with the external printed circuit board 63.

Figure 21:
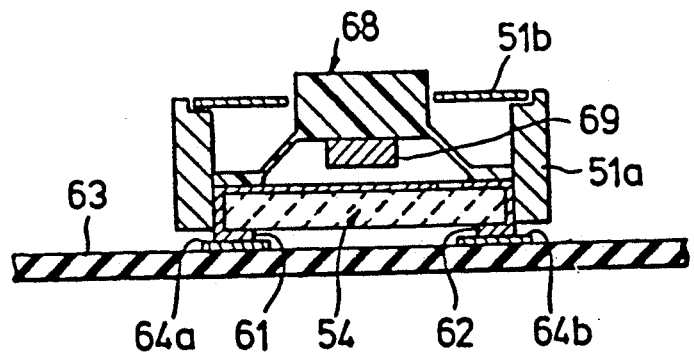
FIG. 21 is a cross sectional view showing an essential part of a modification of the fourth embodiment.

FIG. 21 shows a modification of the fourth embodiment. In FIG. 21, those parts which are the same as those corresponding parts in FIG. 14 are designated by the same reference numerals, and a description thereof will be omitted. In the present modification, a push button 68 made of silicon rubber and a conductive rubber 69 arranged at a position confronting the contact portions 59 are used instead of the push button 52 and the flexible contact piece 53 shown in FIG. 14. Although not shown, it is possible to provide penetrating holes which penetrate the ceramic substrate 55 instead of providing the semi-circular grooves 56.

According to the circuit board of the present invention mounted with the push switch, it is possible to solder the lead portions 61 and 62 directly on the printed circuit board 63, and the push switch 50 can be mounted on the printed circuit board 63 with ease. In addition, since the lead portions 61 and 62 are formed in continuous with the contact portions 59 through the side surfaces of the contact substrate 54, there is no need to provide special lead wires or the like for drawing the contact portions 59 to the lower surface 65-2, and the number of parts required is effectively reduced.

As described heretofore, the conductor layer of the circuit board according to the present invention is plated, and for this reason, the process of forming the conductor layer on the ceramic substrate can be carried out at a low temperature. Moreover, the formation of the through hole electrodes can be carried out simultaneously as the formation of the conductor layer. Therefore, it is possible to reduce the number of parts required and reduce the number of processes required to produce the circuit board.

In the fourth embodiment, the present invention is applied to a miniature push switch. However, the application of the present invention is not limited to such, and the present invention is perfectly applicable to other electronic parts and devices such as a tuner.

Further, the present invention is not limited to these embodiments, but various variations and modifications may be made without departing from the scope of the present invention.

What is claimed is:

1. A circuit board comprising:
an insulative ceramic substrate;
electrode portions and wiring portions of a conductor layer on said ceramic substrate;
a resistor layer on said ceramic substrate and connected to said electrode portions, said resistor layer comprising a thick film resistor on said ceramic substrate; and
a pair of connecting thick film conductors respectively for electrically connecting opposite ends of said thick film resistor to said conductor layer.
said conductor layer having an end portion which is formed directly on said connecting thick film conductors and partially overlaps said thick film resistor, and
each said connecting thick film conductor being directly on said ceramic substrate, and said thick film resistor having an end portion which is directly on said connecting thick film conductor, the end portion of said conductor layer overlapping the end portion of said thick film resistor above said connecting thick film conductor.

2. A circuit board as claimed in claim 1 in which said connecting thick film conductors are made of silver palladium.

3. A circuit board as claimed in claim 1 which further comprises a thick film insulator for bonding on said ceramic substrate, said conductor layer being on thick film insulator.

4. A circuit board as claimed in claim 3 in which said thick film insulator is made of the same material as said ceramic substrate.

* * * * *